(12) United States Patent
Ng et al.

(10) Patent No.: US 11,367,667 B2
(45) Date of Patent: Jun. 21, 2022

(54) BUILD-UP PACKAGE FOR INTEGRATED CIRCUIT DEVICES, AND METHODS OF MAKING SAME

(71) Applicant: Micron Technology, Inc., Boise, ID (US)

(72) Inventors: Hong Wan Ng, Singapore (SG); Choon Kuan Lee, Singapore (SG); David J. Corisis, Nampa, ID (US); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/819,486

(22) Filed: Mar. 16, 2020

(65) Prior Publication Data
US 2020/0286801 A1    Sep. 10, 2020

Related U.S. Application Data

(62) Division of application No. 15/145,760, filed on May 3, 2016, now Pat. No. 10,593,607, which is a division
(Continued)

(51) Int. Cl.
*H01L 23/18* (2006.01)
*H01L 21/56* (2006.01)
(Continued)

(52) U.S. Cl.
CPC .............. *H01L 23/18* (2013.01); *H01L 21/56* (2013.01); *H01L 21/565* (2013.01);
(Continued)

(58) Field of Classification Search
CPC combination set(s) only.
See application file for complete search history.

(56) References Cited

U.S. PATENT DOCUMENTS

| 6,122,171 A | 9/2000 | Akram et al. |
| 6,164,837 A | 12/2000 | Haake et al. |

(Continued)

OTHER PUBLICATIONS

"Garrou, P., Wafer Level Chip Scale Packaging (WL-CSP): An Overview, IEEE Transactions on Advanced Packaging, 23(2):198-205, May 2000."

(Continued)

*Primary Examiner* — Yu-Hsi D Sun
(74) *Attorney, Agent, or Firm* — Perkins Coie LLP

(57) ABSTRACT

A device is disclosed which includes, in one illustrative example, an integrated circuit die having an active surface and a molded body extending around a perimeter of the die, the molded body having lips that are positioned above a portion of the active surface of the die. Another illustrative example includes an integrated circuit die having an active surface, a molded body extending around a perimeter of the die and a CTE buffer material formed around at least a portion of the perimeter of the die adjacent the active surface of the die, wherein the CTE buffer material is positioned between a portion of the die and a portion of the molded body and wherein the CTE buffer material has a coefficient of thermal expansion that is intermediate a coefficient of thermal expansion for the die and a coefficient of thermal expansion for the molded body.

17 Claims, 7 Drawing Sheets

Related U.S. Application Data of application No. 14/307,238, filed on Jun. 17, 2014, now Pat. No. 9,355,994, which is a division of application No. 13/182,069, filed on Jul. 13, 2011, now Pat. No. 8,754,537, which is a division of application No. 12/753,562, filed on Apr. 2, 2010, now abandoned, which is a division of application No. 11/768,413, filed on Jun. 26, 2007, now Pat. No. 7,691,682.

(51) Int. Cl.
 *H01L 23/31* (2006.01)
 *H01L 23/00* (2006.01)
 *H01L 23/373* (2006.01)
 *H01L 21/78* (2006.01)

(52) U.S. Cl.
 CPC ........ *H01L 21/568* (2013.01); *H01L 23/3107* (2013.01); *H01L 23/373* (2013.01); *H01L 24/13* (2013.01); *H01L 24/19* (2013.01); *H01L 24/95* (2013.01); *H01L 24/96* (2013.01); *H01L 21/7806* (2013.01); *H01L 2224/05001* (2013.01); *H01L 2224/05008* (2013.01); *H01L 2224/05024* (2013.01); *H01L 2224/05026* (2013.01); *H01L 2224/05124* (2013.01); *H01L 2224/05144* (2013.01); *H01L 2224/05147* (2013.01); *H01L 2224/05568* (2013.01); *H01L 2224/05624* (2013.01); *H01L 2224/05644* (2013.01); *H01L 2224/12105* (2013.01); *H01L 2924/01029* (2013.01); *H01L 2924/10253* (2013.01); *H01L 2924/14* (2013.01); *H01L 2924/181* (2013.01); *H01L 2924/18162* (2013.01); *H01L 2924/19041* (2013.01); *H01L 2924/3512* (2013.01)

(56) References Cited

U.S. PATENT DOCUMENTS

| | | | |
|---|---|---|---|
| 6,211,572 B1 | 4/2001 | Fjelstad et al. | |
| 6,426,875 B1 | 7/2002 | Akram et al. | |
| 6,462,414 B1 | 10/2002 | Anderson | |
| 6,493,229 B2 | 12/2002 | Akram et al. | |
| 6,504,238 B2 | 1/2003 | Cheng et al. | |
| 6,555,412 B1 | 4/2003 | Wensel | |
| 6,555,898 B2 | 4/2003 | Wensel | |
| 6,563,712 B2 | 5/2003 | Akram et al. | |
| 6,566,741 B2 | 5/2003 | Lin et al. | |
| 6,667,439 B2 | 12/2003 | Salatino et al. | |
| 6,720,650 B2 | 4/2004 | Miyazaki | |
| 6,731,011 B2 | 5/2004 | Verma et al. | |
| 6,764,877 B2 | 7/2004 | Lin et al. | |
| 6,888,238 B1 | 5/2005 | Li | |
| 6,917,525 B2 | 7/2005 | Mok et al. | |
| 6,929,978 B2 | 8/2005 | Anderson | |
| 7,005,730 B2 | 2/2006 | Verma et al. | |
| 7,049,166 B2 | 5/2006 | Salatino et al. | |
| 7,112,879 B2 | 9/2006 | Fjelstad et al. | |
| 7,161,239 B2 | 1/2007 | Zhao et al. | |
| 7,254,024 B2 | 8/2007 | Salmon | |
| 7,510,910 B2 * | 3/2009 | Yamagata | H01L 21/78 438/118 |
| 7,691,682 B2 | 4/2010 | Wan et al. | |
| 8,754,537 B2 | 6/2014 | Ng et al. | |
| 2004/0155352 A1 * | 8/2004 | Ma | H01L 24/97 257/758 |
| 2005/0202590 A1 * | 9/2005 | Huang | H01L 24/96 438/106 |
| 2006/0033196 A1 | 2/2006 | Yang et al. | |
| 2008/0157303 A1 | 7/2008 | Yang | |
| 2011/0266701 A1 | 11/2011 | Wan et al. | |
| 2014/0295622 A1 | 10/2014 | Ng et al. | |

OTHER PUBLICATIONS

"Kelly, G. et al., Investigation of Thermo-Mechanically Induced Stress in a PQFP 160 Using Finite Element Techniques, Proceedings of the 42nd Electronic Components and Technology Conference, IEEE, pp. 467-472, May 1992."

"Wolf, S. et al., Silicon Processing for the VLSI Rea, vol. 1, pp. 408-409, Sep. 1986."

* cited by examiner

BUILD-UP PACKAGE FOR INTEGRATED CIRCUIT DEVICES, AND METHODS OF MAKING SAME

CROSS-REFERENCE TO RELATED APPLICATIONS

This application is a divisional of U.S. application Ser. No. 15/145,760 filed May 3, 2016, now U.S. Pat. No. 10,593,607, which is a divisional of U.S. application Ser. No. 14/307,238 filed Jun. 17, 2014, now U.S. Pat. No. 9,355,994, which is a divisional of U.S. application Ser. No. 13/182,069 filed Jul. 13, 2011, now U.S. Pat. No. 8,754,537, which is a divisional of U.S. application Ser. No. 12/753,562 filed Apr. 2, 2010, which is a divisional of U.S. application Ser. No. 11/768,413 filed Jun. 26, 2007, now U.S. Pat. No. 7,691,682, each of which is incorporated herein by reference.

BACKGROUND OF THE INVENTION

Technical Field

The present invention is generally directed to the field of packaged integrated circuit devices, and, more particularly, to a novel build-up-package for integrated circuit devices and methods of making same.

Description of the Related Art

Integrated circuit technology uses electrical devices, e.g., transistors, resistors, capacitors, etc., to formulate vast arrays of functional circuits. The complexity of these circuits requires the use of an ever-increasing number of linked electrical devices so that the circuit may perform its intended function. As the number of transistors increases, the integrated circuitry dimensions shrink. One challenge in the semiconductor industry is to develop improved methods for electrically connecting and packaging circuit devices which are fabricated on the same and/or on different wafers or chips. In general, it is desirable in the semiconductor industry to construct transistors which occupy less surface area on the silicon chip/die.

In the manufacture of semiconductor device assemblies, a single semiconductor die is most commonly incorporated into each sealed package. Many different package styles are used, including dual inline packages (DIP), zig-zag inline packages (ZIP), small outline J-bends (SOJ), thin small outline packages (TSOP), plastic leaded chip carriers (PLCC), small outline integrated circuits (SOIC), plastic quad flat packs (PQFP) and interdigitated leadframe (IDF). Some semiconductor device assemblies are connected to a substrate, such as a circuit board, prior to encapsulation. Manufacturers are under constant pressure to reduce the size of the packaged integrated circuit device and to increase the packaging density in packaging integrated circuit devices.

So-called build-up-packaging (BUP) is a commonly employed technique for packaging integrated circuit devices. In general, build-up-packaging involves forming a mold compound material adjacent the sides of an integrated circuit die. Typically, this is accomplished by placing a plurality of singulated die on a section of tape, with the active side of the integrated circuit die being in contact with the tape. Thereafter, mold compound material is formed in the regions between and around the plurality of die. Typically, the mold compound may take the shape of a generally circular wafer. The thickness of the mold compound is approximately the same as that of the die that are subjected to the molding process. Eventually, after subsequent processing, the packaged die are singulated by cutting the mold material to achieve the desired package size.

FIGS. 1A-1B are, respectively, a cross-sectional side view and a plan view of an illustrative integrated circuit device packaged using the build-up technique described above. The packaged integrated circuit 10 is comprised of an integrated circuit die 12, a molded body 14, a first insulating layer 16, e.g., polyimide, a layer 18 of conductive lines or traces, and a second insulating layer 20. A schematically depicted bond pad 15 is formed on the active surface 13 of the die 12. The bond pad 15 is conductively coupled to the conductive layer 18, which may sometimes be referred to as a redistribution layer. A ball pad 22 and conductive ball 24 are conductively coupled to the conductive layer 18. In FIG. 1B, the first and second insulating layers 16, 20 are not shown for purposes of clarity. Of course, it is to be understood that FIGS. 1A-1B are schematic in nature and not intended to provide every detail associated with such prior art devices.

One problem associated with integrated circuit devices packaged using such build-up techniques is there is a tendency for the conductive lines or traces that are part of the conductive layer 18 to fail or crack at or near the interface 26 between the body of the die 12 and the molded body 14 in the area indicated by the dashed-line circle in FIG. 1B. Obviously, such defects may be detrimental and perhaps fatal to the operation of the packaged integrated circuit device 10.

BRIEF DESCRIPTION OF THE DRAWINGS

The present subject matter may be understood by reference to the following description taken in conjunction with the accompanying drawings, in which like reference numerals identify like elements, and in which.

Figure 1A:
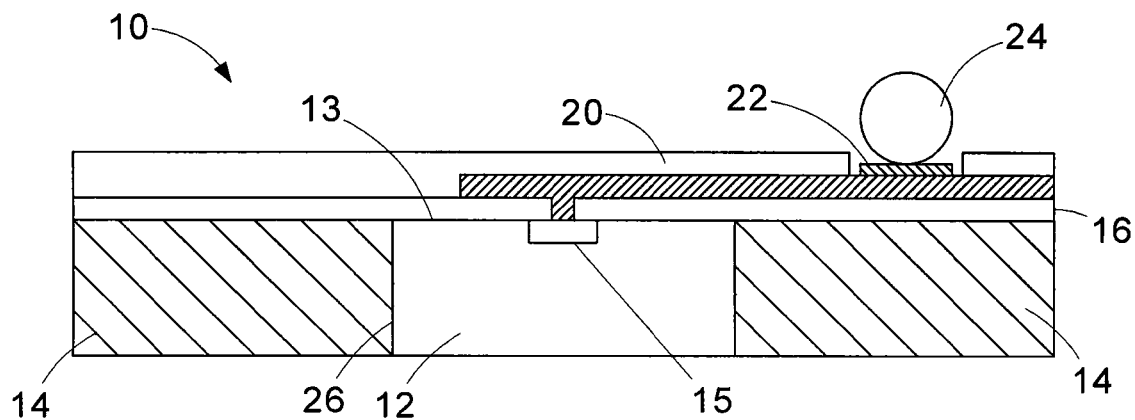
FIGS. 1A-1B schematically depict an illustrative integrated circuit device packaged using a build-up technique.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the present subject matter are described below. In the interest of clarity, not all features of an actual implementation are described in this specification. Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the subject matter disclosed herein.

Figure 2A:
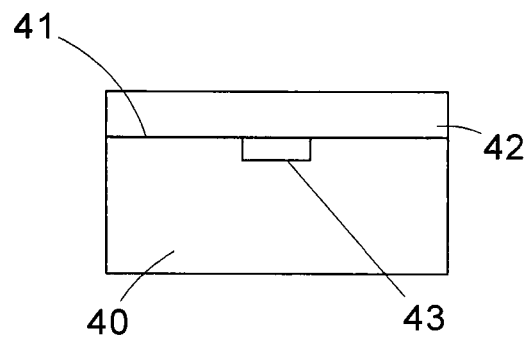
FIGS. 2A-2F schematically depict an illustrative process flow for making a novel packaged integrated circuit device, as disclosed herein.

FIGS. 2A-2F schematically depict one illustrative process flow for manufacturing the novel packaged integrated circuit devices disclosed herein. As shown in FIG. 2A, a layer of material 42 is formed above an active face 41 of an integrated circuit die 40. The die 40 has a plurality of bond pads 43, only one of which is depicted in FIG. 2A. The die 40 may be of any shape or thickness and it may be any type of integrated circuit device, e.g., a memory device, a logic device, an application specific integrated circuit device, etc. Thus, the present disclosure should not be considered as limited to any particular type of integrated circuit device. The bond pad 43 is schematic in nature as it is intended to represent any arrangement or configuration of bond pads that may be formed on the active surface 43 of the die 40. Similarly, the layer 42 may be comprised of a variety of materials and it may be formed using a variety of techniques. In one illustrative embodiment, the layer of material 42 is a layer of insulating material, e.g., polyimide, having a thickness of approximately 5-30 µm. The layer 42 may be formed by performing a variety of known techniques, e.g., spin-coating followed by curing, deposition, etc. Thus, the present subject matter should not be considered as limited to any particular material or method of manufacture for the layer 42.

Figure 2B:
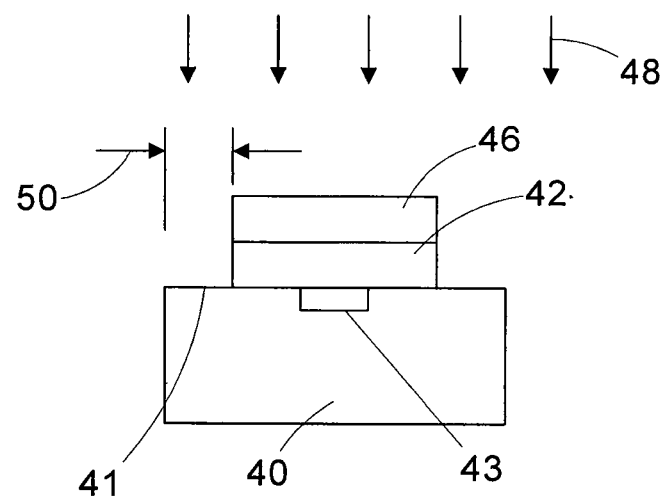

Next, as shown in FIG. 2B, a masking layer 46 is formed above the layer 42 and an etching process, as indicated by the arrows 48, is performed to remove the portions of the layer 42 that are not covered by the masking layer 46. However, the width 50 need not be uniform around the entire perimeter of the die 40 in all applications. In one illustrative example, the width 50 of the removed portion may be approximately 100-500 µm. The masking layer 46 may be comprised of any material that is capable of performing the masking function, e.g., photoresist. The etching process 48 may be performed using traditional equipment and recipes to remove the exposed portions of the layer 42. After the etching process 48 is completed, the masking layer 46 may be removed.

Figure 2C:
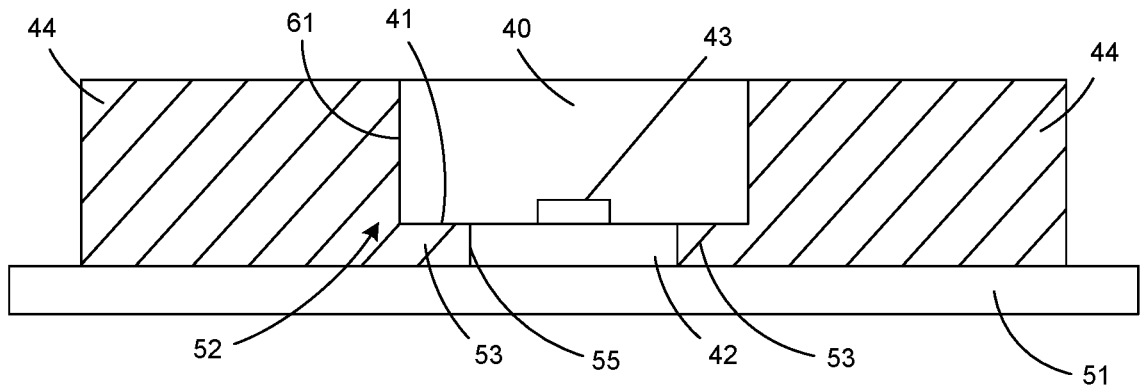
Figure 2D:
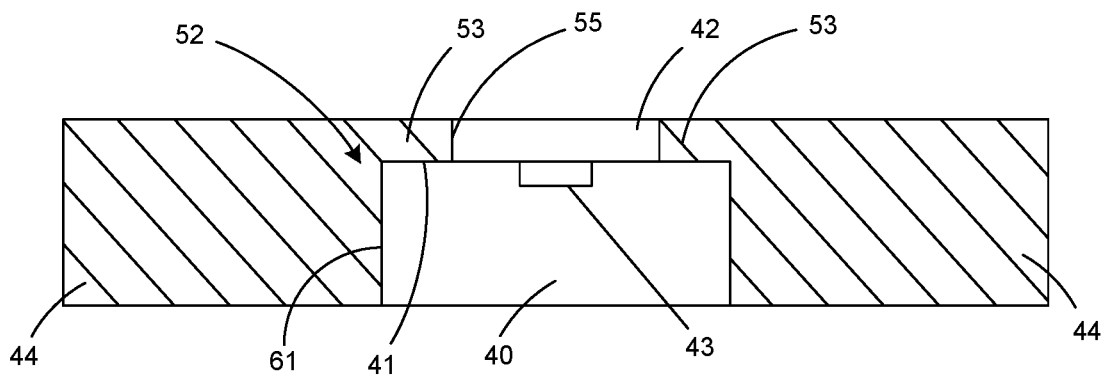

Next, as shown in FIG. 2C, the structure is placed face down on a section of tape 51 and a molded body 44 is formed around the die 40 using traditional compression molding techniques. The tape 51 is removed in FIG. 2D. Although only a single die 40 is depicted in FIG. 2C, those skilled in the art will understand that, typically, the molded body 44 may be formed around a plurality of individual die 40 that are coupled to the tape 51. The molded body 44 may have an overall circular configuration, much like a semiconductor wafer, with a plurality of die 40 embedded therein. The molded body 44 may be made using a variety of known compression molding techniques, materials and equipment. In one illustrative embodiment, the molded body 44 is comprised of mold compound or encapsulant material that is commonly employed in encapsulating integrated circuit die. Note that the molded body 44 has a thickness that approximately corresponds to the combined thickness of the die 40 and the layer 42. As shown in FIGS. 2C and 2D, a portion or lip 53 of the molded body 44 extends above the corner 52 of the integrated circuit die 40. Stated another way, the portion 53 of the molded body 44 is positioned above the portions of the active face 41 of the die 40 that is not covered by the etched layer 42. The portions or extensions 53 of the molded body 44 extend inward beyond the primary vertical interface 61 between the die 40 and the molded body 44. In general, the compound molding process is continued until such time as the lips 53 of the molded body 44 engage or abut the reduced width layer 42 at the interface 55.

Figure 2E:
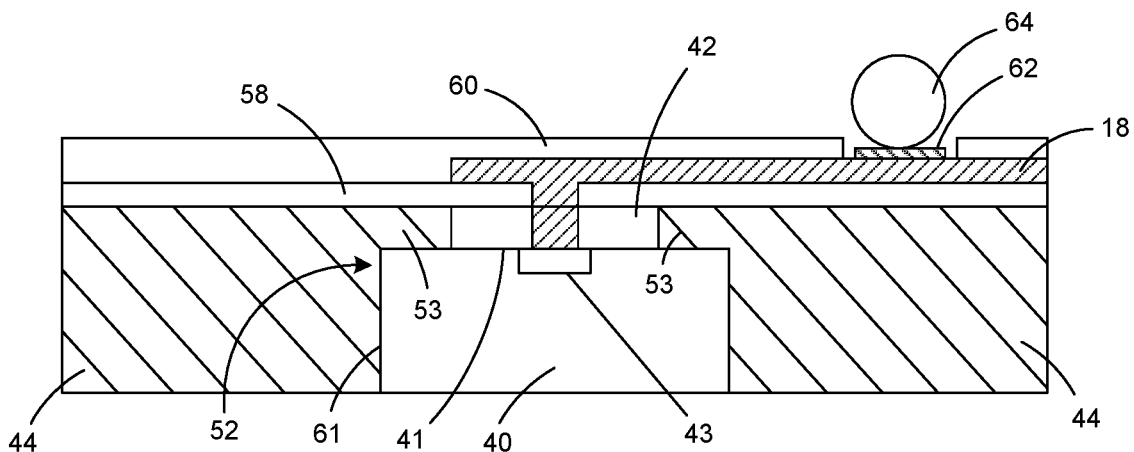

Thereafter, traditional processing techniques and structures may be employed to further complete the packaged integrated circuit device, as reflected in FIG. 2E. More specifically, such processing may involve formation of first and second insulating layers 58 and 60, and the formation of the conductive layer 18 using techniques known to those skilled in the art. Additionally, a ball pad 62 and ball 64 may be formed and conductively coupled to the conductive layer 18 using known techniques and materials. The conductive components may be made of a variety of materials, e.g., copper, aluminum, gold, etc.

Figure 1B:
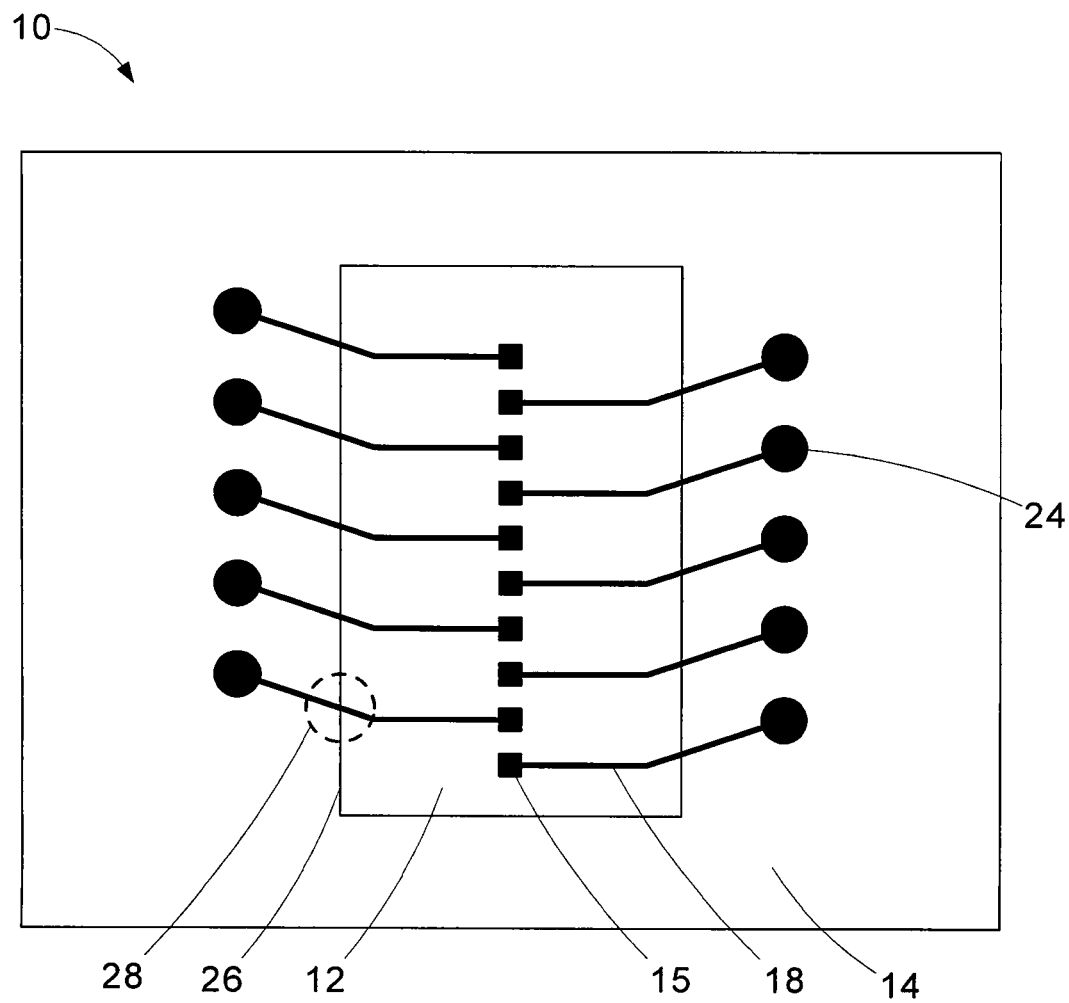
Figure 2F:
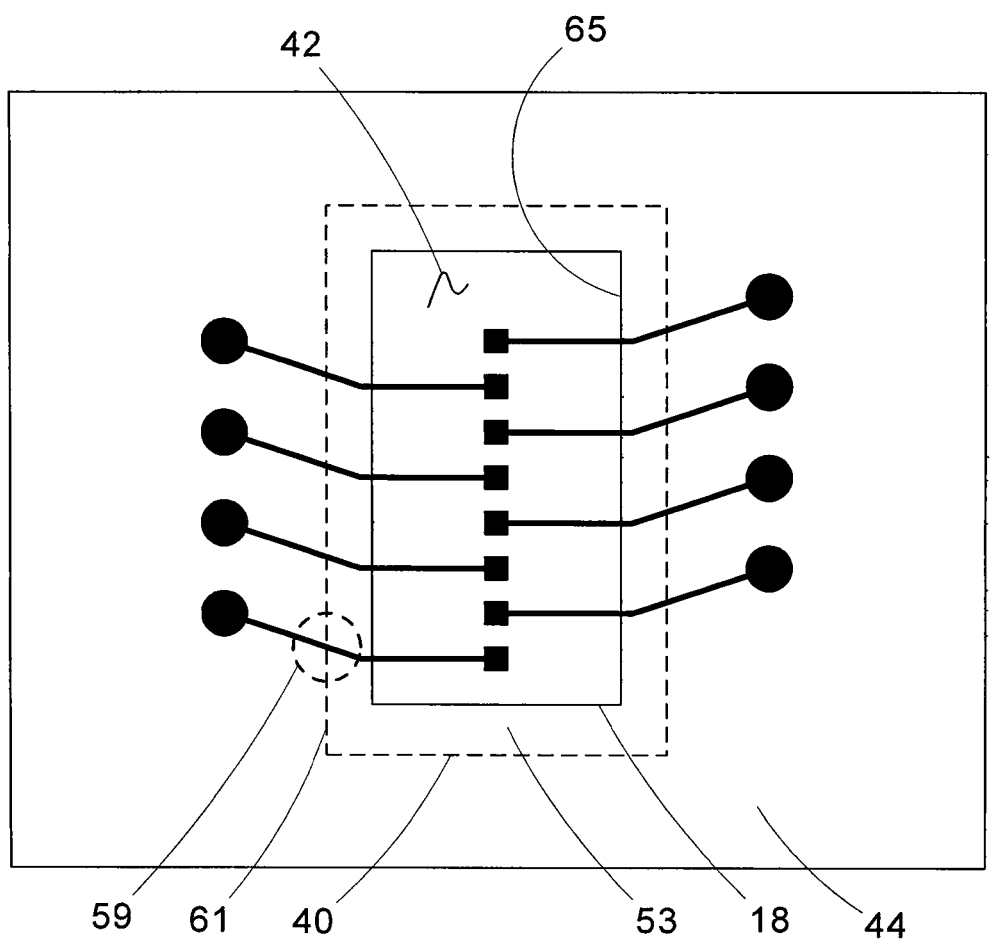

FIG. 2F is a schematically depicted plan view of the resulting packaged die (without the insulating layers above the layer 42 depicted). As shown therein, the extensions 53 of the molded body 44 extend inwardly above the active face 41 of the die 40 beyond the primary vertical interface 61 between the die 40 and the molded body 44. Stated another way, the extensions 53 define a window 65 that has a footprint or size that is less than the footprint or size of the active face 41 of the underlying die 40. Accordingly, the conductive traces tend to experience less stress in the region indicated by the dashed-line circle 59 as compared to prior art BUP packaged devices, like the illustrative package depicted in FIGS. 1A-1B.

Figure 3A:
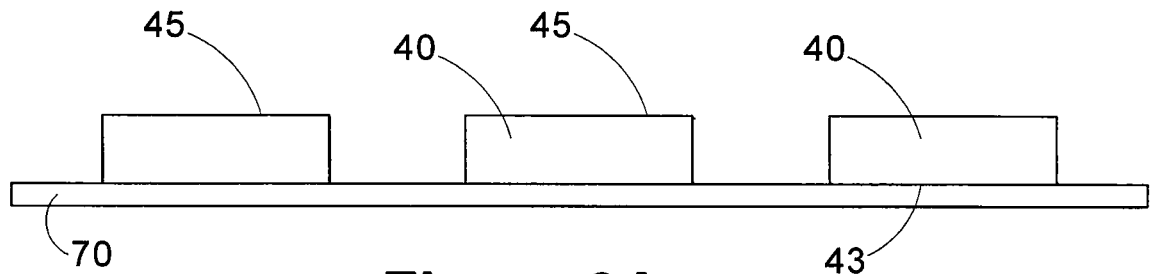
FIGS. 3A-3I schematically depict another illustrative process flow for making a novel packaged integrated circuit device, as disclosed herein.

FIGS. 3A-3I depict another illustrative embodiment of a novel packaged integrated circuit device disclosed herein. In FIG. 3A, a plurality of singulated die 40 are attached to a section of tape 70. The active face 43 of the die 40 engages the tape 70.

Figure 3B:
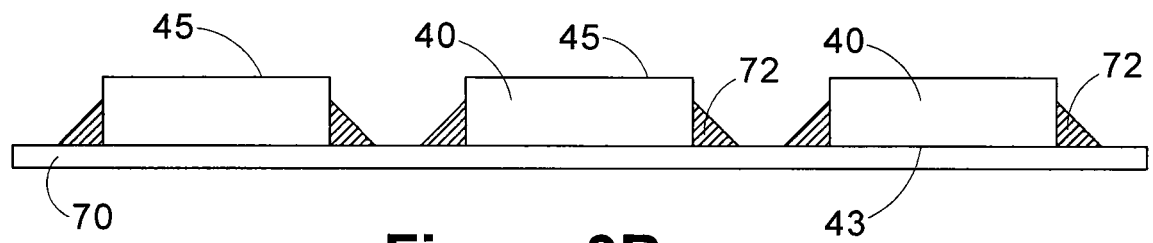

Next, as shown in FIG. 3B, a CTE (coefficient of thermal expansion) buffer material 72 is formed around at least a portion of the perimeter of each of the die 40. In the illustrative example depicted in FIG. 3B, the CTE buffer material 72 is positioned around the entire perimeter of the die 40, although that is not required in all configurations. In general, the CTE buffer material 72 may have a coefficient of thermal expansion that is intermediate the coefficient of thermal expansion for the die 40 and the coefficient of thermal expansion for the molded body 44 that is to be formed adjacent the die 40. The CTE buffer material 72 may be comprised of a variety of different materials and it may be formed using a variety of techniques. In one illustrative example, the CTE buffer material 72 is a material that may be dispensed as a liquid or liquid-like material and thereafter cured. The size of the CTE buffer material 72 may also vary depending upon the particular application. In some cases, the CTE buffer material 72 may have an approximately triangular shaped cross-sectional configuration (as shown in FIG. 3B), with a leg length equal to approximately one-half the thickness of the die 40. In the illustrative example where the die 40 has a thickness of approximately 300-500 µm, the leg length of the CTE buffer material 72 may be approximately 150-250 µm. In one particularly illustrative embodiment, the CTE buffer material 72 may be comprised of traditional underfill material, or other liquid encapsulant material, having a coefficient of thermal expansion of approximately 4.14 ppm/° C. As an example, the die 40 may have a coefficient of thermal expansion of approximately 2.69 ppm/° C. while the molded body 44 may have a coefficient of thermal expansion of approximately 8.28 ppm/° C.

Figure 3C:
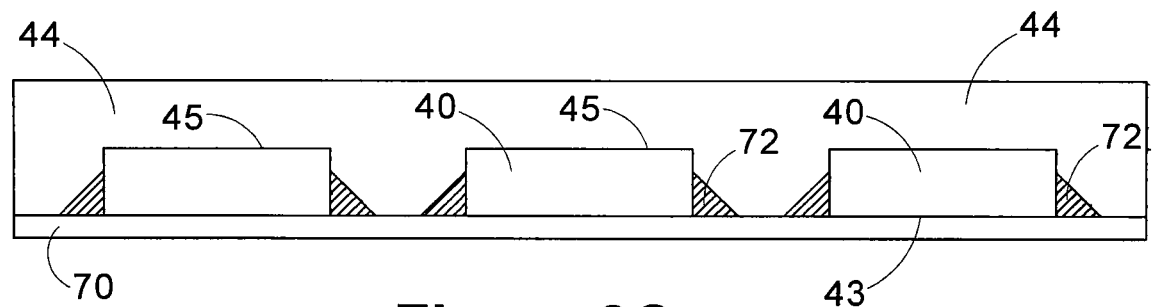
Figure 3D:
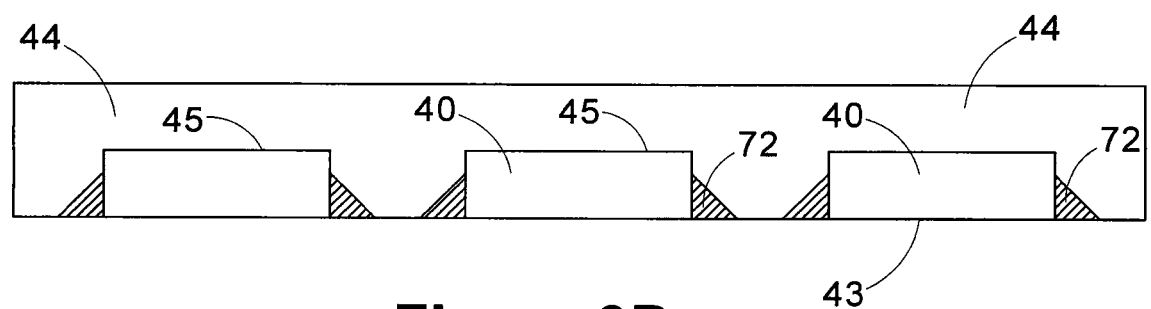
Figure 3E:
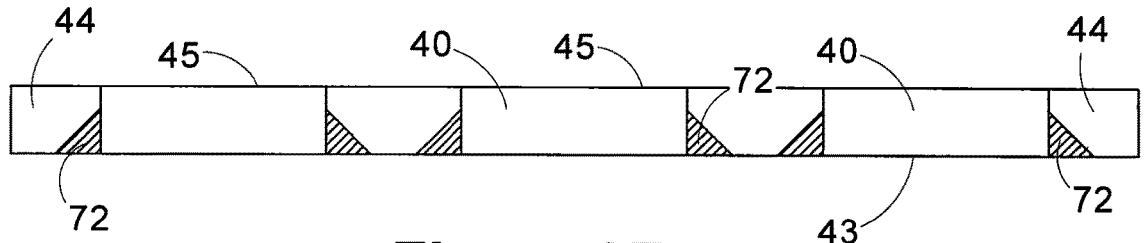
Figure 3F:
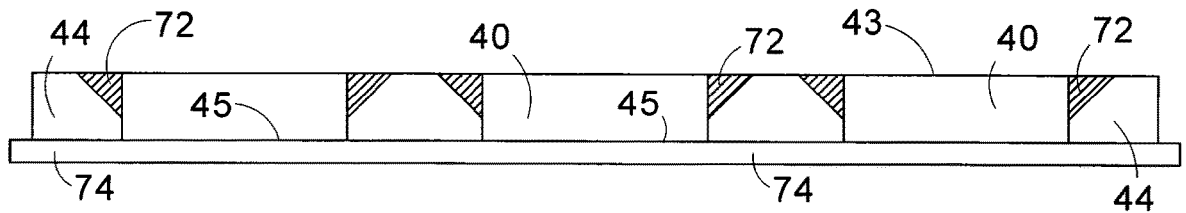
Figure 3G:
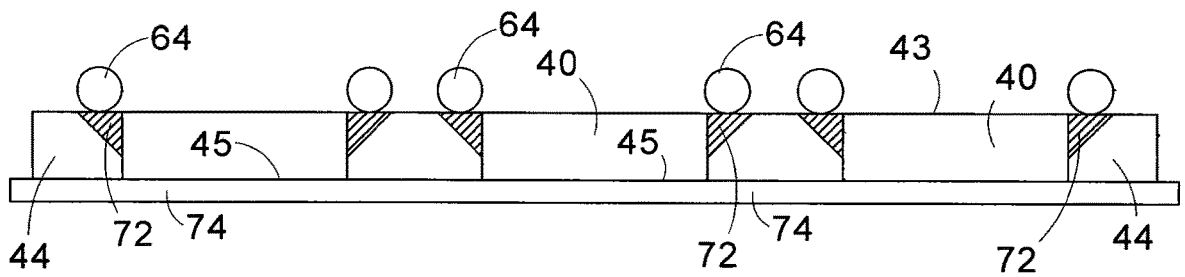
Figure 3H:
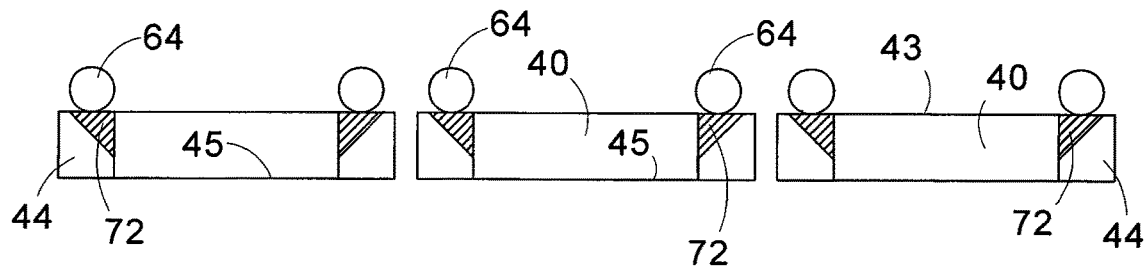

Next, as shown in FIG. 3C, the molded body 44 is formed around the plurality of singulated die 40 using known compressed molded techniques. Thereafter, the tape 70 is removed, as shown in FIG. 3D. Then, as shown in FIG. 3E, if desired, a grinding process may be performed to remove excess amounts of the molded body 44 from above the back surface 45 of the die 40. Of course, this grinding process need not be performed in all applications. After the grinding process is completed, another portion of tape 74 is attached to the back of the die 40/molded body 44. Next, as shown in FIG. 3G, traditional fabrication techniques are employed to form the necessary insulation layers, conductive layers and conductive balls 64, as described previously. Thereafter, as shown in FIG. 3H, the packaged die are singulated using traditional techniques.

Figure 3I:
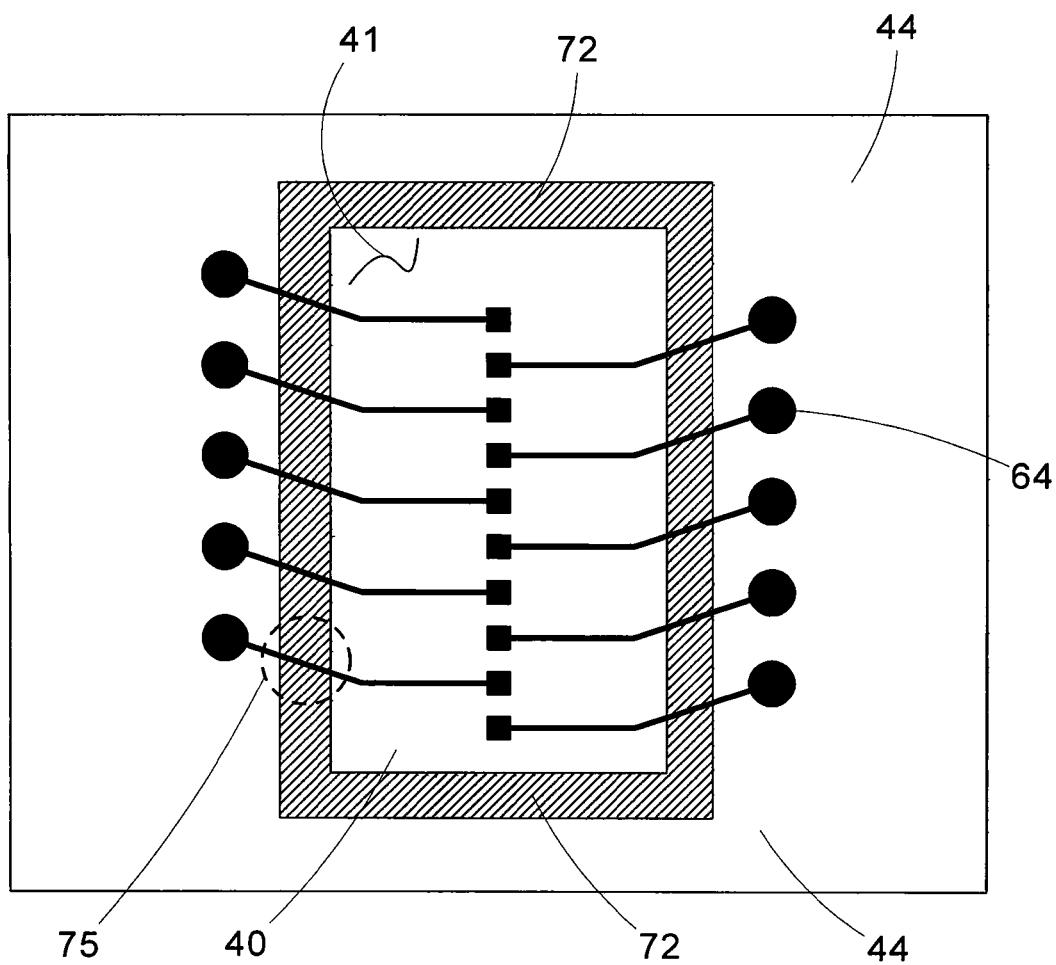

FIG. 3I is a plan view depicting the packaged die (without the insulating materials present). As shown in this particular example, the CTE buffer material 72 essentially rings the perimeter of the die 40. Stated another way, in one illustrative embodiment, the CTE buffer material 72 is positioned between the die 40 and the molded body 44, at least at the substantially coplanar upper surfaces of the die 40, CTE buffer material 72 and molded body 44. In some cases, the CTE buffer material 72 may only be positioned along the side surfaces of the die 40 where the conductive traces will cross. The presence of the CTE buffer material 72, with its intermediate coefficient of thermal expansion, tends to reduce the localized stresses seen by the conductive traces in at least the region indicated by dashed lines 75.

What is claimed:

1. A device, comprising:
   an integrated circuit die having an active surface, a backside opposite the active surface, and a sidewall extending between the active surface and the backside;
   a molded body extending around a perimeter of the die; and
   a CTE buffer material formed around at least a portion of the perimeter of the die adjacent the active surface of the die, wherein the CTE buffer material is positioned between a portion of the die and a portion of the molded body, and wherein the CTE buffer material has a coefficient of thermal expansion that is intermediate between a coefficient of thermal expansion for the die and a coefficient of thermal expansion for the molded body,
   wherein a first portion of the sidewall adjacent the active surface is in direct contact with the CTE buffer material, and
   wherein a second portion of the sidewall adjacent the backside is in direct contact with the molded body.

2. The device of claim 1, wherein the CTE buffer material extends around the entire perimeter of the die.

3. The device of claim 1, wherein the CTE buffer material has a coefficient of thermal expansion of approximately 4.14 ppm/° C.

4. The device of claim 1, wherein the CTE buffer material has a thickness in the direction of the active surface of the die of approximately 150-250 µm.

5. The device of claim 1, wherein the CTE buffer material has a triangular shaped cross-sectional configuration.

6. The device of claim 1 wherein the CTE buffer material has an upper surface, and wherein the upper surface of the CTE buffer material is directly adjacent the active surface of the die.

7. The device of claim 6 wherein the CTE buffer material contacts the active surface of the die.

8. The device of claim 1 wherein:
   the CTE buffer material includes an upper surface, and
   the CTE buffer material is in direct contact with the first portion of the sidewall, and the upper surface of the CTE buffer material is directly adjacent to the active surface of the die.

9. The device of claim 1 wherein the first portion of the sidewall and the second portion of the sidewall are vertically aligned.

10. A device, comprising:
    an integrated circuit die having an active surface, a backside, and a sidewall extending between the active surface and the backside;
    a molded body extending around a perimeter of the die; and
    a ring of CTE buffer material positioned between the die and the molded body at the active surface of the die,
    wherein a first portion of the sidewall adjacent the active surface is in physical contact with the CTE buffer material, and
    wherein a second portion of the sidewall adjacent the backside is in physical contact with the molded body.

11. The device of claim 10, wherein the CTE buffer material has a coefficient of thermal expansion that is intermediate a coefficient of thermal expansion for the die and a coefficient of thermal expansion for the molded body.

12. The device of claim 10, wherein the CTE buffer material has a triangular shaped cross-sectional configuration.

13. The device of claim 10, wherein an upper surface of the molded body and an upper surface of the CTE buffer material are substantially coplanar.

14. The device of claim 10 wherein the CTE buffer material includes an upper surface, and wherein the upper surface of the CTE buffer is directly adjacent to the active surface of the die.

15. The device of claim 14 wherein the CTE buffer material contacts the active surface of the die.

16. The device of claim 10 wherein:
    the CTE buffer material includes an upper surface, and
    the CTE buffer material is in direct contact with the first portion of the sidewall, and the upper surface of the CTE buffer material is directly adjacent to the active surface of the die.

17. The device of claim 10 wherein the first portion of the sidewall and the second portion of the sidewall are vertically aligned.

* * * * *